(12) United States Patent
Schneider et al.

(10) Patent No.: US 10,883,812 B2
(45) Date of Patent: Jan. 5, 2021

(54) CALIBRATING A MAGNETIC TRANSMITTER

(71) Applicant: Ascension Technology Corporation, Shelburne, VT (US)

(72) Inventors: Mark Robert Schneider, Willistown, VT (US); Charles Robertson, Shelburne, VT (US); Joseph Bruce Durfee, Colchester, VT (US)

(73) Assignee: Ascension Technology Corporation, Shelburne, VT (US)

( * ) Notice: Subject to any disclaimer, the term of this patent is extended or adjusted under 35 U.S.C. 154(b) by 114 days.

(21) Appl. No.: 16/252,350

(22) Filed: Jan. 18, 2019

(65) Prior Publication Data

US 2019/0226825 A1 Jul. 25, 2019

Related U.S. Application Data

(60) Provisional application No. 62/619,624, filed on Jan. 19, 2018.

(51) Int. Cl.
*G01R 33/00* (2006.01)
*G01B 7/004* (2006.01)
(Continued)

(52) U.S. Cl.
CPC ............ *G01B 7/004* (2013.01); *G01C 17/38* (2013.01); *G01R 33/0035* (2013.01);
(Continued)

(58) Field of Classification Search
CPC .... G01B 7/004; G01C 17/38; G01R 33/0035; G01R 33/00; G01R 33/0023;
(Continued)

(56) References Cited

U.S. PATENT DOCUMENTS 4,109,199 A 8/1978 Ball et al.
6,242,907 B1 6/2001 Clymer et al.
(Continued)

FOREIGN PATENT DOCUMENTS

EP 2002290 1/2007
EP 2660561 1/2012
(Continued)

OTHER PUBLICATIONS

ES Search Report in ES Application No. 201930034, dated Feb. 19, 2020, 7 pages (with English translation).
(Continued)

*Primary Examiner* — Patrick Assouad
*Assistant Examiner* — Taqi R Nasir
(74) *Attorney, Agent, or Firm* — Fish & Richardson P.C.

(57) ABSTRACT

A calibration device comprising: a plurality of magnetic sensors positioned at the calibration device, the plurality of magnetic sensors defining a space; a controller configured to be positioned in the space defined by the plurality of magnetic sensors, wherein the controller includes a magnetic transmitter; and one or more processors configured to: cause the magnetic transmitter to generate magnetic fields; receive signals from the plurality of magnetic sensors that are based on characteristics of the magnetic fields received at the plurality of magnetic sensors; calculate, based on the signals received from the plurality of magnetic sensors, positions and orientations of the plurality of magnetic sensors relative to a position and orientation of the magnetic transmitter; and determine whether the calculated positions and orientations of the plurality of magnetic sensors are within one or more threshold limits of known positions and orientations of the plurality of magnetic sensors.

21 Claims, 4 Drawing Sheets

(51) Int. Cl.
*G01C 17/38* (2006.01)
*G06F 3/01* (2006.01)
*G06F 3/0346* (2013.01)

(52) U.S. Cl.
CPC ............ *G06F 3/017* (2013.01); *G06F 3/0346* (2013.01); *G06F 3/012* (2013.01)

(58) Field of Classification Search
CPC . G01R 33/0017; G01R 31/3191; G06F 3/017; G06F 3/0346; G06F 3/012; G06F 30/13; G06T 7/00; G06Q 10/06
See application file for complete search history.

(56) References Cited

U.S. PATENT DOCUMENTS

| | | | |
|---|---|---|---|
| 6,252,393 B1 | 6/2001 | Hedengren | |
| 6,335,617 B1 * | 1/2002 | Osadchy | A61B 5/06 324/202 |
| 6,400,139 B1 | 6/2002 | Khalfin et al. | |
| 6,427,079 B1 | 7/2002 | Schneider et al. | |
| 6,643,597 B1 | 11/2003 | Dunsmore | |
| 7,719,261 B2 | 5/2010 | Geck et al. | |
| 7,876,090 B2 | 1/2011 | Branson | |
| 7,878,064 B2 | 2/2011 | Abbott et al. | |
| 7,996,057 B2 | 8/2011 | Govari et al. | |
| 8,635,043 B1 | 1/2014 | Olsson et al. | |
| 9,316,714 B2 | 4/2016 | Rada et al. | |
| 9,335,383 B2 | 5/2016 | Fukasawa et al. | |
| 9,411,022 B2 | 8/2016 | Berman et al. | |
| 9,559,793 B2 | 1/2017 | Meiyappan | |
| 2006/0255795 A1 | 11/2006 | Higgins et al. | |
| 2008/0262772 A1 * | 10/2008 | Luinge | A61B 5/1114 702/94 |
| 2014/0188422 A1 | 7/2014 | Huber et al. | |
| 2015/0145625 A1 | 5/2015 | Fukasawa et al. | |
| 2015/0325151 A1 | 11/2015 | Tuchschmid et al. | |
| 2016/0345286 A1 * | 11/2016 | Jamieson | G01S 3/023 |
| 2017/0067981 A1 | 3/2017 | Hannah et al. | |
| 2017/0172409 A1 | 6/2017 | Cavin | |
| 2017/0307891 A1 * | 10/2017 | Bucknor | G01S 1/70 |
| 2017/0351094 A1 | 12/2017 | Poulos et al. | |
| 2018/0088185 A1 * | 3/2018 | Woods | G01R 35/00 |
| 2020/0182662 A1 * | 6/2020 | Chave | G01D 5/20 |

FOREIGN PATENT DOCUMENTS

| | | |
|---|---|---|
| WO | WO 2007/058526 | 5/2007 |
| WO | WO 2017/072407 A1 | 5/2017 |

OTHER PUBLICATIONS

ES Search Report in ES Application No. 201930033, dated Jan. 30, 2020, 7 pages (with English translation).
DE Search Report in DE Application No. 102019200650, dated Sep. 6, 2019, 7 pages.
DE Search Report in DE Application No. 102019200652, dated Sep. 6, 2019, 7 pages.
ES Search Report in ES Application No. 201930033, dated Jul. 17, 2019, 5 pages.

* cited by examiner

CALIBRATING A MAGNETIC TRANSMITTER

CLAIM OF PRIORITY

This application claims priority under 35 USC § 119(e) to U.S. Patent Application Ser. No. 62/619,624, filed on Jan. 19, 2018, the entire contents of which are hereby incorporated by reference.

TECHNICAL FIELD

This disclosure relates to calibrating a magnetic transmitter.

BACKGROUND

Augmented Reality (AR), Virtual Reality (VR) and other systems can use Electromagnetic Tracking (EMT) systems to aid location of devices in various contexts (e.g., gaming, medical, etc.). Such systems utilize a magnetic transmitter in proximity to a magnetic sensor such that the sensor and the transmitter can be spatially located relative to each other. Improper calibration of the transmitter with respect to the sensor (or vice versa) can cause the EMT system to report incorrect positions for the sensor or transmitter.

SUMMARY

Calibration of a magnetic transmitter can be performed by positioning the transmitter in a calibration device that includes a plurality of magnetic sensors positioned at various known locations and orientations in the calibration device. The transmitter can generate one or more magnetic fields, and the plurality of sensors spaced at known locations of the calibration device receive the generated magnetic fields and convert the magnetic fields into one or more electrical signals indicative of the position and orientation of the respective sensor relative to the transmitter. In particular, a computer system receives the electrical signals from each sensor and converts the electrical signals into position and orientation (P&O) data that indicates the position and orientation of the respective sensor relative to the transmitter.

Because the position and orientation of each sensor relative to the transmitter is known, a determination can be made as to whether the electrical signals generated by the plurality of sensors accurately represent the positions and orientations of the sensors relative to the transmitter. If it is determined that the signals generated by the plurality of sensors do not provide an accurate representation of the positional relationship between the sensors and transmitters, the computer system can determine one or more calibration correction factors using a calibration algorithm. The calibration correction factors can be used to calibrate the particular transmitter such that magnetic fields generated by the transmitter result in accurate determination of positions and orientations of the sensor relative to the transmitter (e.g., and accurate determination of positions and orientations of sensors used in AR, VR, and/or EMT systems).

In general, in an aspect, a calibration device includes a plurality of magnetic sensors positioned at the calibration device, the plurality of magnetic sensors defining a space, a controller configured to be positioned in the space defined by the plurality of magnetic sensors, wherein the controller includes a magnetic transmitter, and one or more processors configured to cause the magnetic transmitter to generate a plurality of magnetic fields, receive signals from the plurality of magnetic sensors that are based on characteristics of the plurality of magnetic fields received at the plurality of magnetic sensors, calculate, based on the signals received from the plurality of magnetic sensors, positions and orientations of the plurality of magnetic sensors relative to a position and orientation of the controller and the magnetic transmitter, and determine whether the calculated positions and orientations of the plurality of magnetic sensors are within one or more threshold limits of known positions and orientations of the plurality of magnetic sensors.

Implementations can include one or more of the following features.

In some implementations, the one or more processors are further configured to determine, based on a calibration algorithm, one or more calibration correction factors for the magnetic transmitter based on differences between the measured positions and orientations of the plurality of magnetic sensors and the known positions and orientations of the plurality of magnetic sensors.

In some implementations, the one or more processors are further configured to create a calibration file that includes the calibration correction factors, and apply the calibration file to the magnetic transmitter.

In some implementations, the one or more threshold limits are zero such that calibration correction factors are determined for the magnetic transmitter irrespective of the differences between the measured positions and orientations of the plurality of magnetic sensors and the known positions and orientations of the plurality of magnetic sensors.

In some implementations, the calibration device includes a mount that is configured to hold the controller and the magnetic transmitter in a fixed position and orientation relative to the plurality of sensors.

In some implementations, the controller is configured to communicate with the calibration device.

In some implementations, the controller is configured for use in one of both of an Augmented Reality (AR) system or a Virtual Reality (VR) system.

In some implementations, at least some of the plurality of magnetic sensors are removably fixed to the calibration device.

In some implementations, at least some of the plurality of magnetic sensors are movably attached to the calibration device such that one or both of the position or orientation of the at least some of the plurality of magnetic sensors is adjustable.

In some implementations, the one or more processors are in communication with a multiplexing switch that allows the one or more processors to receive the signals from each of the plurality of magnetic sensors in series.

In some implementations, the calibration device includes a mount that is configured to accept a reference controller that includes a calibrated magnetic transmitter, and the one or more processors are further configured to cause the calibrated magnetic transmitter to generate a second plurality of magnetic fields, receive second signals from the plurality of magnetic sensors that are based on characteristics of the second plurality of magnetic fields received at the plurality of magnetic sensors, and calculate, based on the second signals received from the plurality of magnetic sensors, the known positions and orientations of the plurality of magnetic sensors relative to a position and orientation of the reference controller and the calibrated magnetic transmitter.

In some implementations, one or more calibration correction factors are determined for one or more of the plurality of magnetic sensors prior to use in the calibration device.

In some implementations, the one or more processors are further configured to create one or more calibration files that include the calibration correction factors, and apply the one or more calibration files to the one or more of the plurality of magnetic sensors.

In general, in an aspect, a system includes a controller that includes a magnetic transmitter, and a calibration device comprising a housing, a plurality of magnetic sensors positioned at the housing, and a mount positioned inside the housing which is configured to accept the controller. The system also includes a computer system in communication with the calibration device. The computer system is configured to cause the magnetic transmitter to generate a plurality of magnetic fields, receive signals from the plurality of magnetic sensors that are based on characteristics of the plurality of magnetic fields received at the plurality of magnetic sensors, calculate, based on the signals received from the plurality of magnetic sensors, positions and orientations of the plurality of magnetic sensors relative to a position and orientation of the controller and the magnetic transmitter, and determine whether the calculated positions and orientations of the plurality of magnetic sensors are within one or more threshold limits of known positions and orientations of the plurality of magnetic sensors.

Implementations can include one or more of the following features.

In some implementations, the computer system is further configured to determine, based on a calibration algorithm, one or more calibration correction factors for the magnetic transmitter based on differences between the measured positions and orientations of the plurality of magnetic sensors and the known positions and orientations of the plurality of magnetic sensors.

In some implementations, the computer system is further configured to create a calibration file that includes the calibration correction factors, and apply the calibration file to the magnetic transmitter.

In some implementations, the mount is configured to hold the controller and the magnetic transmitter in a fixed position and orientation relative to the plurality of sensors.

In some implementations, the controller is configured to communicate with one or both of the computer system or the calibration device.

In some implementations, the controller is configured for use in one of both of an Augmented Reality (AR) system or a Virtual Reality (VR) system.

In some implementations, at least some of the plurality of magnetic sensors are removably fixed to the calibration device.

In some implementations, at least some of the plurality of magnetic sensors are movably attached to the calibration device such that one or both of the position or orientation of the at least some of the plurality of magnetic sensors is adjustable.

In some implementations, the system includes a multiplexing switch in communication with the computer system that allows the computer system to receive the signals from each of the plurality of magnetic sensors in series.

In some implementations, the mount is configured to accept a reference controller that includes a calibrated magnetic transmitter, and the computer system is further configured to cause the calibrated magnetic transmitter to generate a second plurality of magnetic fields, receive second signals from the plurality of magnetic sensors that are based on characteristics of the second plurality of magnetic fields received at the plurality of magnetic sensors, and calculate, based on the second signals received from the plurality of magnetic sensors, the known positions and orientations of the plurality of magnetic sensors relative to a position and orientation of the reference controller and the calibrated magnetic transmitter.

In some implementations, one or more calibration correction factors are determined for one or more of the plurality of magnetic sensors prior to use in the calibration device.

In some implementations, the computer system is further configured to create one or more calibration files that include the calibration correction factors, and apply the one or more calibration files to the one or more of the plurality of magnetic sensors.

Advantages of the systems and techniques described herein include using a dedicated calibration device to calibrate multiple transmitters (e.g., multiple devices under test (DUT)) quickly and accurately. For example, the positions and orientations of various sensors of the calibration device can be determined relative to the transmitter DUT, with the position and orientation of each sensor being determined concurrently or rapidly in series. The calibration device does not require moving parts (e.g. moving a sensor to multiple different locations). Rather, a series of sensors are positioned at predetermined known locations. Such a calibration device simplifies the calibration procedure and speeds up calibration and testing. The need for a three-axis translation system and/or orientation system (e.g., such as one that includes a gantry and/or gimbal) is eliminated.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
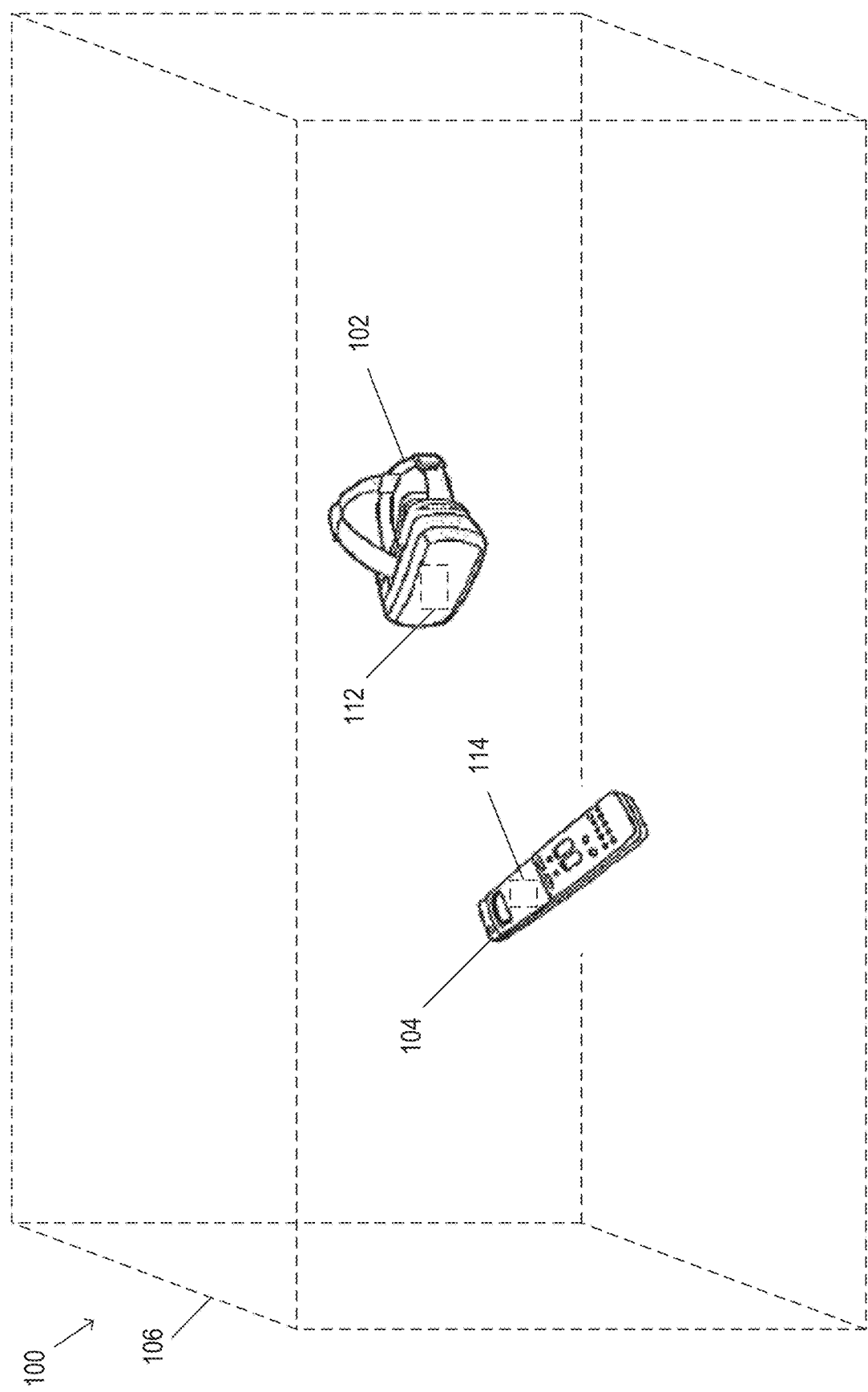
FIG. 1 is a schematic diagram of an example Electromagnetic Tracking (EMT) system.

An Electromagnetic Tracking (EMT) system can be used in gaming and/or surgical settings to track devices (e.g., gaming controllers, head-mounted displays, medical equipment, robotic arms, etc.), thereby allowing their respective three-dimensional positions and orientations to be known to a user of the system. Augmented Reality (AR) and Virtual Reality (VR) systems also use EMT systems to perform head, hand, and body tracking, for example, to synchronize the user's movement with the AR/VR content. Such EMT systems use a magnetic transmitter in proximity to a magnetic sensor to determine the position and/or orientation of the sensor relative to the transmitter. Transmitters and sensors used in such systems can be calibrated to ensure that the transmitters and sensors can provide accurate position and orientation information to the user. If an EMT sensor or transmitter is not calibrated or is improperly calibrated, accuracy can be greatly diminished.

Calibration of a magnetic transmitter can be performed by positioning the transmitter in a calibration device that includes a plurality of magnetic sensors positioned at various physically known locations and orientations and/or calibration determined known locations and orientations in the calibration device. For example, the calibration device may include a mount configured to receive a device (e.g., a gaming controller) that includes the transmitter. A computer system in communication with the calibration device can cause the transmitter to generate one or more magnetic fields. The plurality of sensors spaced at known locations of the calibration device receive the generated magnetic fields and convert the magnetic fields into one or more electrical signals indicative of the position and orientation of the respective sensor relative to the transmitter. In particular, the computer system converts the electrical signals received from each sensor into position and orientation (P&O) data that indicates the position and orientation of the respective sensor relative to the transmitter. In this way, the computer system determines the position and orientation of the sensors with respect to the transmitter.

Because the position and orientation of each sensor relative to the transmitter is known, the computer system can determine whether the electrical signals generated by the plurality of sensors accurately matches the physically and/or calibration determined known positions and orientations of the sensors relative to the transmitter. If the computer system determines that the signals generated by the plurality of sensors do not provide an accurate representation of the positional relationship between the sensors and transmitter, the computer system can determine one or more calibration correction factors according to a calibration algorithm. The calibration correction factors can be used to calibrate the particular transmitter such that magnetic fields generated by the transmitter result in accurate P&O data determined by an AR, VR, and/or EMT system in which the transmitter is included.

FIG. 1 shows an example of an EMT system 100 that can be used as part of a VR/AR or other system (e.g., medical system). The EMT system 100 includes at least a head-mounted display (HMD) 102 that includes a magnetic sensor 112 and a controller 104 that includes a magnetic transmitter 114. The HMD 102 and the controller 104 are configured to track position (e.g., in x, y, and z) and orientation (e.g., in azimuth, altitude, and roll) in three-dimensional space relative to each other. For example, the transmitter 114 of the controller 104 is configured to track the sensor 112 of the HMD 102 relative to a reference frame defined by the position and orientation of the transmitter 114, or the sensor 112 of the HMD 102 is configured to track the transmitter 114 of the controller 104 relative to a reference frame defined by the position and orientation of the sensor 112. The particular sensor 112 and transmitter 114 employed by the EMT system 100 may be determined by the procedure type, measurement performance requirements, etc.

The position and orientation of the HMD 102 and the controller 104 can be tracked relative to each other within a tracking volume 106. While the tracking volume 106 is illustrated as being a defined space, it should be understood that the tracking volume 106 may be any three-dimensional space, including dimensionless three-dimensional spaces (e.g., large indoor and/or outdoor areas, etc.).

In some implementations, the transmitter 114 includes three orthogonally wound magnetic coils, referred to herein as the x, y, and z coils. Electrical currents traveling through the three coils cause the coils to produce three orthogonal magnetic fields at three frequencies (e.g., three different frequencies) for FDM (frequency division multiplexing) applications or three pulses (e.g., three different time slots) for TDM (time division multiplexing) applications. The three frequencies may be three closely spaced frequencies, e.g., 34 KHz, 34.25 KHz, and 34.5 KHz, although other frequencies can also or alternatively be used. In some implementations, the coils may produce magnetic fields at the same frequency but, for example, used in a TDM fashion. The sensor 112 also includes three orthogonally wound magnetic coils, referred to herein as the x, y, and z coils. Voltages are induced in the coils of the sensor 112 in response to the sensed magnetic fields by means of magnetic induction. Each coil of the sensor 112 generates an electrical signal for each of the magnetic fields generated by the coils of the transmitter 114; for example, the x coil of the sensor 112 generates a first electrical signal in response to the magnetic field received from the x coil of the transmitter 114, a second electrical signal in response to the magnetic field received from they coil of the transmitter 114, and a third electrical signal in response to the magnetic field received from the z coil of the transmitter 114. They and z coils of the sensor 112 similarly generate electrical signals for each of the magnetic fields received from each coil of the transmitter 114. The sensor may also include other sensing elements that measure magnetic fields, e.g., Hall effect elements, etc.

The data from the sensor 112 can be represented as a matrix of data (e.g., a 3×3 matrix), which can be resolved into the position and orientation of the sensor 112 with respect to the transmitter 114, or vice versa. In this way, the position and orientation of the sensor 112 and the transmitter 114 is measured. In particular, electronics incorporated into the HMD 102 are configured to determine the position and orientation of the controller 104 relative to the HMD 102 based on the characteristics of the magnetic fields generated by the transmitter 114 and the various electrical signals generated by the sensor 112. As described below, a separate computer system (e.g., the computer system 212 of FIGS. 2 and 3) may also be configured to determine the position and orientation of a sensor and/or a transmitter.

If the transmitter 114 and/or the sensor 112 is not calibrated accurately, the determined (e.g., calculated) position and orientation of the transmitter 114 and/or sensor 112 may not reflect the true (e.g., actual) position and orientation.

Calibrating the Transmitter

Figure 2:
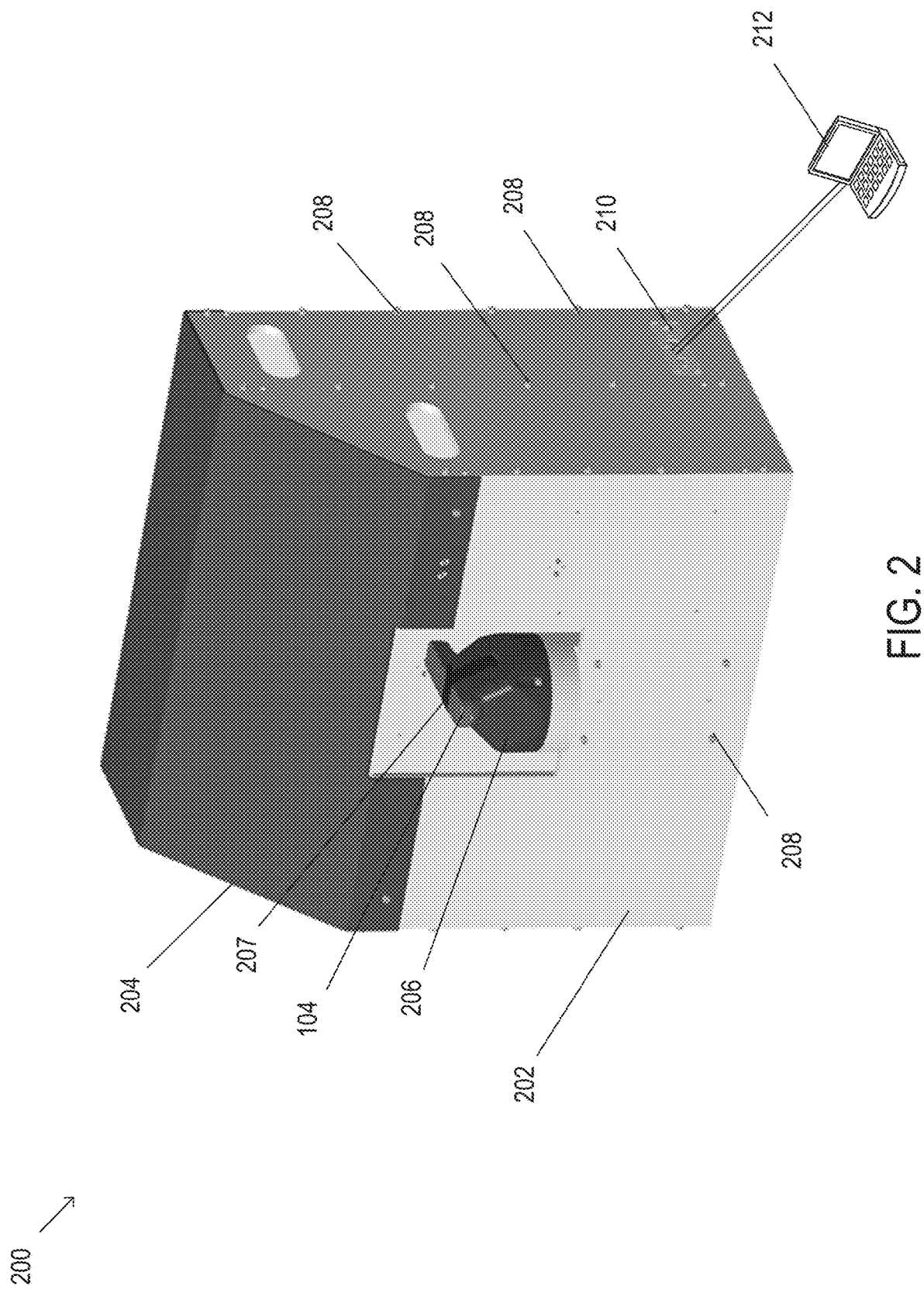
FIG. 2 shows an example of a calibration device for calibrating a transmitter for use in the EMT system of FIG. 1.

FIG. 2 shows an example of a calibration device 200 for calibrating a transmitter (e.g., the transmitter 114 of FIG. 1). The calibration device 200 may be used to calibrate the transmitter 114 while the transmitter 114 is incorporated in (e.g., housed in) the controller 104. The calibration device 200 may be configured to calibrate a plurality of devices under test (e.g., DUT). That is, the calibration device 200 can calibrate a first DUT in the form of a first transmitter incorporated in a first controller, a second DUT in the form of a second transmitter incorporated in a second controller, etc. Such calibration of multiple DUT can ensure that all transmitters 114 and controllers 104 across various EMT systems 100 have common calibration characteristics.

In the illustrated example, the calibration device 200 includes a housing 202 and a cover 204. The cover 204 may be pivotably connected to the housing 202 such that the cover 204 can be opened to provide access to a mount 206 that resides inside the housing 202. In some implementations, the mount 206 resides toward a front surface of the housing 202. In some implementations, the mount 206 may be accessible through an aperture in the housing 202. The mount 206 is configured to accept a device for calibration. For example, the controller 104 including the transmitter 114 of FIG. 1 can be placed on the mount 206 for calibration. The mount 206 includes a strap 207 to assist in fixing the controller 104 to the mount 206 during calibration. In some implementations, the mount 206 may alternatively or additionally include another fixing element, such as a harness, for helping to hold the controller 104 in place. While the calibration device 200 includes the mount 206 in the illustrated example, in some implementations, the mount 206 may be omitted. For example, the controller 104 can be placed at (e.g., on, in, etc.) the calibration device 200 on a mounting surface (e.g., a surface of the calibration device 200 that is configured to accept the controller 104). In other words, a dedicated mount is not required for maintaining the controller 104 in a particular position and orientation.

The calibration device 200 includes a group of sensors 208 positioned on and/or in and/or throughout the calibration device 200. In some implementations, the calibration device includes twelve sensors 208, although fewer or additional sensors 208 may be used. For example, one or more of the sensors 208 may be positioned on an outside surface of the housing 202, on an inside surface of the housing 202, in an interior of the housing 202, on an inside bottom surface of the housing 202, on an outside bottom surface of the housing 202, on an outside surface of the cover 204, on an inside surface of the cover 204, suspended in an interior of the housing 202 and/or cover 204, etc. Some of the sensors 208 are omitted or otherwise not shown in the illustration of FIG. 2. The group of sensors 208 is sometimes referred to as a sensor tree, or a tree of sensors. The calibration device 200 also includes a communications interface 210 that allows the calibration device 200 to interact with a computing device, such as a computer system 212. That is, the communications interface 210 facilitates communication between the calibration device 200 and the computer system 212. While the computer system 212 is illustrated as being connected to the calibration device 200 by a wired connection, in some implementations, the calibration device 200 may include wireless communication capabilities such that the calibration device 200 can wirelessly communicate with the computer system 212. The sensors 208 are connected to the communications interface 210 such that the computer system 212 can communicate with the sensors 208 (e.g., receive signals from the sensors 208 and provide information to the sensors 208).

In some implementations, the calibration device 200 may employ one or more additional/different techniques than what is described with respect to FIG. 2 for allowing the sensors 208 to be positioned at (e.g., on, in, throughout, etc.) the calibration device 200 at particular positions and/or orientations. For example, in some implementations, the calibration device 200 may not include a housing as illustrated in FIG. 2, but may include one or more mounting locations/surfaces for accepting the sensors 208. The calibration device 200 may employ one or more of a variety of techniques for maintaining the sensors 208 in the particular positions/orientations as described herein. The sensors 208 are positioned such that the sensors 208 define a three dimensional space within which the controller 104 (and, e.g., the mount 206) can be positioned.

Each of the sensors 208 has a known physical position and orientation relative to the mount 206. The known physical position and orientation of the sensors 208 may be determined by various means, including using a known good EMT system to determine the sensor 208 position and orientation with respect to a known good transmitter placed on mount 206 (e.g., the reference transmitter and reference controller 304 described with respect to FIG. 3 below). In some implementations, each of the sensors 208 may be previously calibrated before being used for calibrating the transmitter 114. For example, each of the sensors 208 may be calibrated using a separate process (e.g., using a Helmholtz calibration device) before the sensors 208 are incorporated into the calibration device 200. Such calibration may cause one or more calibration correction factors to be applied to the respective sensor 208. The mount 206 is configured to accept the controller 104 in a fixed, predetermined position and orientation. The transmitter 114 is positioned in the controller 104 at a fixed, predetermined position and orientation. Therefore, the position and orientation of each of the sensors 208 relative to the transmitter 114 is known.

Before the transmitter 114 is calibrated, the calibration device 200 may undergo its own calibration to ensure that the sensors 208 are at known positions/orientations relative to a reference transmitter that has known calibrations. Such calibration of the calibration device 200 is described in more detail below.

After confirming that the calibration device 200 is calibrated, a first DUT is placed on the mount 206. In particular, the controller 104 including the transmitter 114 is positioned on the mount 206. In some implementations, the mount 206 may include electrical contacts that are configured to form electrical connections with electrical contacts of the controller 104 such that the calibration device 200 and the controller 104 can interact and exchange information. In some implementations, the controller 104 may otherwise be electrically connected to the calibration device 200 and/or connected to the computer system 212 (e.g., by a universal serial bus (USB) cable). In some implementations, the controller 104 may be configured to exchange information with the calibration device 200 and/or the computer system 212 over a wireless connection.

With the controller 104 in place on the mount 206, the computer system 212 can cause the transmitter 114 to generate one or more magnetic fields having particular characteristics. In particular, the computer system 212 causes current to flow through the coils of the transmitter 114, which causes the transmitter 114 to produce three orthogonal magnetic fields at particular frequencies. The magnetic fields generated by the transmitter 114 are received at each of the sensors 208 and induce voltages in the sensor coils.

The characteristics of the magnetic fields generated by the transmitter 114 in combination with the magnitudes of the voltages induced in the coils of the sensors 208 can be used to determine (e.g., measure), for each sensor 208, the position and orientation of the sensor 208 relative to the transmitter 114. In particular, for each sensor 208, the computer system 212 computes from a 3×3 matrix of data the position and orientation of the sensor 208 relative to the transmitter 114 (e.g., sometimes referred to as P&O data). The P&O data is determined for each of the sensors 208 (e.g., in series). In some implementations, each sensor signal is selected in series using multiplexing switches incorporated into the computer system 212. In some implementations, the multiplexing switches may be incorporated as a separate component that resides between the calibration device 200 and the computer system 212.

For each sensor 208, the computer system 212 compares the computed (e.g., measured) P&O data to ideal P&O data that represents the true (e.g., actual, physical or calibration determined) position and orientation of the sensor 208 relative to the transmitter 114. In some implementations, the ideal P&O data is stored on the computer system 212. In some implementations, the ideal P&O data may be computed based on the characteristics of the generated magnetic fields from a reference transmitter and known characteristics of the sensor 208 (e.g., calibration determined positions and orientations). If the measured P&O data matches the ideal P&O data, or if the measured P&O data is within one or more threshold values of the ideal P&O data, a determination may be made that the transmitter 114 does not need calibration, therefore a default ideal calibration can be used. However, if the computed P&O data does not sufficiently match the ideal P&O data, one or more calibration correction factors may be computed and applied for use with the transmitter 114 to correct such inaccuracies and/or to minimize errors due to DUT unit-to-unit variations (e.g., between various transmitters). Such calibration correction factors are determined based on a calibration algorithm. In some implementations, the calibration correction factors may be stored on the transmitter 114, stored on electronics of the controller 104, or stored elsewhere in the EMT 100 in which the transmitter 114 is ultimately incorporated. In some implementations, calibration correction factors may be stored in network storage (e.g., on a server, such as a cloud server) for later use. In some implementations, calibration of the transmitter 114 may take approximately one minute or less.

In some implementations, the calibration device 200 may be configured such that the transmitter 114 is always or almost always calibrated. For example, the one or more threshold values may be zero such that the transmitter 114 is calibrated unless the measured P&O matches the ideal P&O data. In some implementations, the calibration device 200 may be configured to determine calibration correction factors for the transmitter 114 irrespective of the measured P&O data. In this way, the calibration device 200 can be forced to determine calibration correction factors and calibrate the transmitter 114.

In some implementations, a determination may be made that the transmitter 114 does not require calibration. As such, the calibration correction factors may be determined to be zero. In other words, the EMT system 100 may determine that the transmitter 114 does not require calibration because the determined position of the sensor 112 relative to the transmitter 114 is accurate, and such may be indicated by one or more calibration correction factors with a value of zero being determined. If calibration of the transmitter 114 is not required, the transmitter 114 may be left as-is (e.g., no calibration correction factors are applied to the transmitter 114, or calibration correction factors having a value of zero are applied to the transmitter 114, thereby resulting in no change to the way that the transmitter 114 generates magnetic fields).

In some implementations, the sensors 208 may be fixed to various portions of the calibration device 200 by one or more fasteners. For example, the sensors 208 may be held in place on a surface of the calibration device 200 by a screw, nut and bolt, etc. In some implementations, one or more of the sensors 208 may be removably fixed to the calibration device 200. For example, in some implementations, surfaces of the calibration device 200 may include apertures configured to accept one of the sensors 208. In this way, the sensor 208 can be placed (e.g., pressure fit) within the aperture such that the sensor 208 is held in place at a particular location and orientation. In this way, the sensors 208 may be provided separately from the calibration device 200 and placed on/in the calibration device 200 by the user before initial use of the calibration device 200. Such removable nature of the sensors 208 may allow for sensors 208 to be easily replaced. For example, damaged and/or inaccurate sensors 208 can be replaced with new sensors 208 to improve the accuracy of the calibration device.

In some implementations, one or more of the sensors 208 may be fixed to the calibration device 200 in a movable manner. For example, one or more of the sensors 208 may be fixed to a portion of the calibration device 200 that includes a rail and/or slide device that allows the sensor 208 to traverse different positions. In this way, different sensor locations can be used to calibrate the transmitter 114 (e.g., and/or to calibrate the sensors 208, as described in more detail below). In some implementations, one or more of the sensors 208 may be fixed to the calibration device 200 in a manner that allows the orientation of the sensor 208 to be adjusted. In this way, different sensor orientations can be used to calibrate the transmitter 114 (e.g., and/or to calibration the sensors 208, as described in more detail below). For implementations in which the position and/or orientation of the sensors 208 are adjustable, the calibration device 200 may be configured to provide the true (e.g., actual) position and/or orientation of the sensor 208 to the computer system 212 to allow for accurate calibration.

In some implementations, rather than and/or in addition to the computer system 212 being provided as a separate component of the calibration device 200, the calibration device 200 may include one or more computer components (e.g., one or more processors, memory, etc.) such that the calibration device 200 itself includes and/or acts as a computer system. For example, the calibration device 200 may include computer components that cause the calibration device 200 to perform various functionality as described herein with respect to the computer system 212 (e.g., generating the magnetic fields, etc.).

Calibrating the Calibration Device

As described above, the calibration device 200 may undergo a calibration routine to measure the sensors 208 positions/orientations relative to the DUT. A controller/transmitter that are known to be calibrated (e.g., known to produce accurate results) can be used to perform such a calibration of the calibration device 200.

Figure 3:
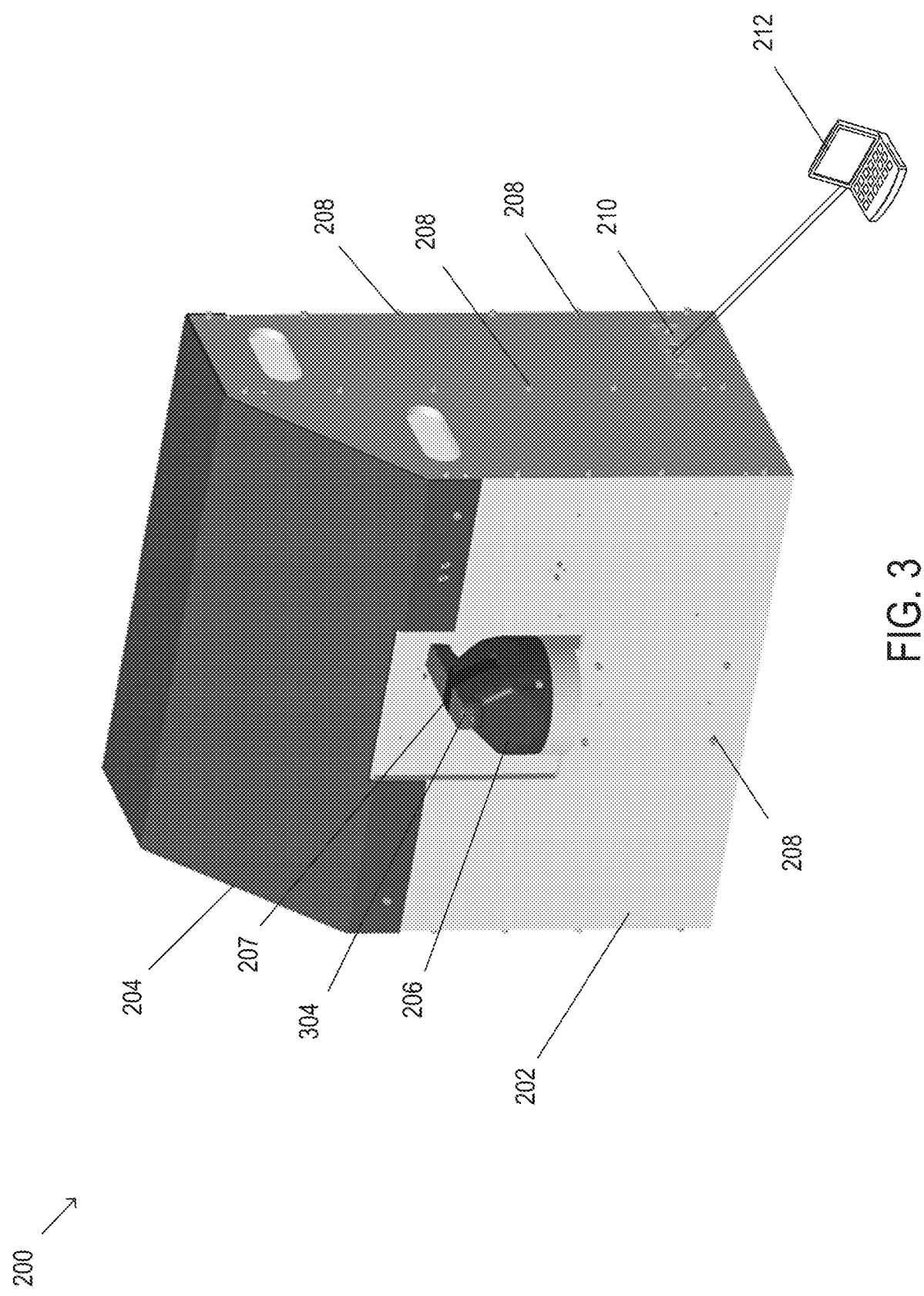
FIG. 3 shows the calibration device of FIG. 2 operating in a self-calibration mode.

FIG. 3 shows an example of the calibration device 200 of FIG. 2 operating in a self-calibration mode. In this example, the controller 104 has been replaced with a reference controller 304. The reference controller 304 includes a reference transmitter (e.g., a calibrated transmitter) that is known to produce accurate results. In other words, the calibrated reference transmitter is calibrated by other means that will result in the sensors 208 providing accurate position/orientation data, provided that the sensors 208 are calibrated.

The reference controller 304 is positioned in/on the mount 206 such that the reference controller 304 assumes a known, fixed position and orientation relative to the sensors 208. In some implementations, the reference controller 304 is electrically connected to the calibration device 200 via one or more electrical contacts in the mount 206 or via a separate wired electrical connection. In some implementations, the reference controller 304 is connected to the computer system 212 by a wireless or wires connection (e.g., via a USB cable). In some implementations, the reference controller 304 may be configured to exchange information with the calibration device 200 and/or the computer system 212 over a wireless connection.

With the reference controller 304 in place on the mount 206, the computer system 212 can cause the reference transmitter to generate one or more magnetic fields having particular characteristics. In particular, the computer system 212 causes current to flow through coils (e.g., three coils) of the reference transmitter, which causes the reference transmitter to produce three orthogonal magnetic fields at particular times or frequencies and at appropriate magnitudes. The magnetic fields generated by the reference transmitter are received at each of the sensors 208 and cause voltages to be induced in the sensor coils.

The characteristics of the magnetic fields generated by the reference transmitter in combination with the magnitudes of the voltages induced in the coils of the sensors 208 can be used to determine, for each sensor 208, the calibration determined position and orientation of the sensor 208 relative to the reference transmitter. In particular, for each sensor 208, the computer system 212 computes from a 3×3 matrix of data the position and orientation of the sensor 208 relative to the reference transmitter and the reference controller 304 (e.g., sometimes referred to as P&O data). The P&O data is determined for each of the sensors 208 (e.g., in series). In some implementations, each sensor signal is selected in series using multiplexing switches incorporated into the computer system 212. In some implementations, the multiplexing switches may be incorporated as a separate component that resides between the calibration device 200 and the computer system 212.

In some implementations, sensor calibration correction factors may be stored on the particular sensor 208 or stored on electronics of the calibration device 200 to ensure that, given a calibrated reference transmitter and reference controller 304, the calibration determined positions and orientations of the sensors 208 are accurate. In some implementations, calibration correction factors may be stored in network storage (e.g., on a server, such as a cloud server) to calibrate one or more of the sensors 208. In some implementations, calibration of the calibration device 200 (e.g., calibration of one or more of the sensors 208) and/or determining the calibration determined positions and orientations of the sensors 208 may take approximately one minute or less.

Once the calibration device 200 (e.g., the sensors 208 of the calibration device 200) has been calibrated or confirmed to be in a calibrated state, and the calibration determined positions and orientations of the sensors 208 are determined, the calibration device 200 may be used for calibration of various DUT transmitters 114. That is, the calibration determined positions and orientations of the sensors 208 can be used as the known (e.g., true) positions and orientations of the sensors 208 when calibrating the various DUT transmitters 114.

Operating the Calibration Device

Whether the calibration device 200 is being used to calibrate a DUT or being calibrated itself, a user of the calibration device 200 and the computer system 212 can perform the calibration procedure by interacting with the computer system 212. In some implementations, the computer system 212 is configured to provide instructions for the user via a graphical user interface (GUI). For example, the computer system 212 may be a laptop computer that is configured to execute a program used for calibrating a DUT or calibrating the calibration device 200. The program can cause a screen of the laptop to display instructions to assist the user in carrying out the particular calibration procedure. For example, the instructions can include textual, visual, and/or audible instructions instructing the user to place the controller 104 or the reference controller 304 in the mount 206, electrically connect the controller 104 or the reference controller 304 to the mount 206 or computer system 212 (e.g., if required to form a wired connection), affix the strap 207 around the controller 104 or the reference controller 304, connect the computer system 212 to the calibration device 200 (e.g., if required to form a wired connection), etc.

In some implementations, the program operating on the computer system 212 may include one or more user-selectable values and/or user-input fields for allowing the user to define one or more characteristics of the calibration procedure. For example, the program may allow the user to specify particular frequencies at which the coils of the transmitter 114 and/or the reference transmitter of the reference controller 304 are to operate in order to generate respective magnetic fields. In some implementations, the program may allow the user to store, recall, and/or apply calibration correction values to the transmitter 114 (e.g., during calibration of the transmitter 114) and/or to one or more of the sensors 208 (e.g., during calibration of the calibration device 200). In some implementations, the program is configured to provide an indication that the transmitter 114 requires calibration, an indication that the transmitter 114 does not require calibration, an indication that the calibration device 200 requires calibration, and/or an indication that the calibration device 200 does not require calibration (e.g., a pass/fail result). For examples in which calibration is required, the program may provide a user interface element that can allow the user to initiate a calibration procedure upon interaction with the user interface element.

In some implementations, the program may be configured to provide an indication of a degree of error present in the transmitter 114 and/or one or more of the sensors 208. For example, during the calibration procedure, if the transmitter 114 and/or one of the sensors 208 provides P&O data indicative of a relatively large amount of error, the program may provide an indication of the degree of error and/or provide an indication that calibration is required for the transmitter 114 and/or the sensor 208. In some examples, during the calibration procedure, if the transmitter 114 and/or one of the sensors 208 provides P&O data indicative of a relatively small degree of error (e.g., the determined position and/or orientation of the transmitter 114 or sensor 208 is close to the true position and/or orientation), the program may provide an indication that a small degree of error exists, and/or may provide an indication that an optional calibration may be performed on the transmitter 114 and/or the sensor 208. In some implementations, an optional re-calibration may be recommended by the program if the computed position or orientation is within one or more threshold values of the true position or orientation of the transmitter 114 or sensor 208.

In some implementations, the calibration device 200 is determined to be calibrated (e.g., such that the calibration device 200 does not require calibration of its sensors 208) if the determined P&O of each of the sensors 208 is within a threshold distance of the actual position of the respective sensor 208. In some implementations, the threshold may be approximately 3 mm for a positional threshold. An angular value (e.g., 0.2 degrees) may be used for an orientation threshold. Thus, for example, if all sensors 208 are determined to be positioned within 3 mm of their actual position (e.g., in all dimensions) and within 0.2 degrees of their actual orientation (e.g., in all dimensions) relative to the reference controller 304, then the computer system 212 may determine that the calibration device 200 is sufficiently calibrated for subsequent use with a DUT transmitter 114.

Similarly, in some implementations, the DUT transmitter 114 is determined to be calibrated (e.g., such that the transmitter 114 does not require calibration) if the determined P&O of each of the sensors 208 is within a threshold distance (e.g., 3 mm in all dimensions) of the actual position of the respective sensor 208. If one or more of the sensors 208 has a determined position that resides outside of the threshold distance, one or more calibration correction factors can be applied to the transmitter 114 such that the transmitter 114 can generate magnetic fields that result in correct identification of the position and orientation of the sensors 208. Other means of determining whether the DUT transmitter 114 is calibrated which are not specifically disclosed herein can also be used.

In some implementations, the calibration device 200 and the computer system 212 may be configured to perform calibrations on different types (e.g., different models) of transmitters. In some implementations, the program may accept an input indicative of the model of the transmitter to be calibrated. Particular parameters stored on the computer system 212 may be implemented during the calibration based on the model of the transmitter in use. For example, a first model of transmitter may call for particular magnitudes of currents to pass through the coils of the transmitter, and/or certain frequencies for the magnetic fields to be generated by the coils, and a second model of transmitter may call for different magnitudes of currents to pass through the coils of the transmitter, and/or different frequencies for the magnetic fields to be generated by the coils.

In some implementations, the calibration correction factors for a particular DUT transmitter 114 may be included as part of a calibration file that is created by the program operating on the computer system 212. For example, once the one or more calibration correction factors are determined, a calibration file may be created that can be used to update a particular DUT transmitter 114. In some implementations, the calibration file may be "flashed" to the DUT transmitter 114. In some implementations, a firmware of the DUT transmitter 114 can be updated based on the calibration file.

In some implementations, the position and orientation of particular sensors 208 (e.g., the physically determined or calibration determined position and orientation of the sensors 208) may be included as part of a calibration file that is created by the program operating on the computer system 212.

Figure 4:
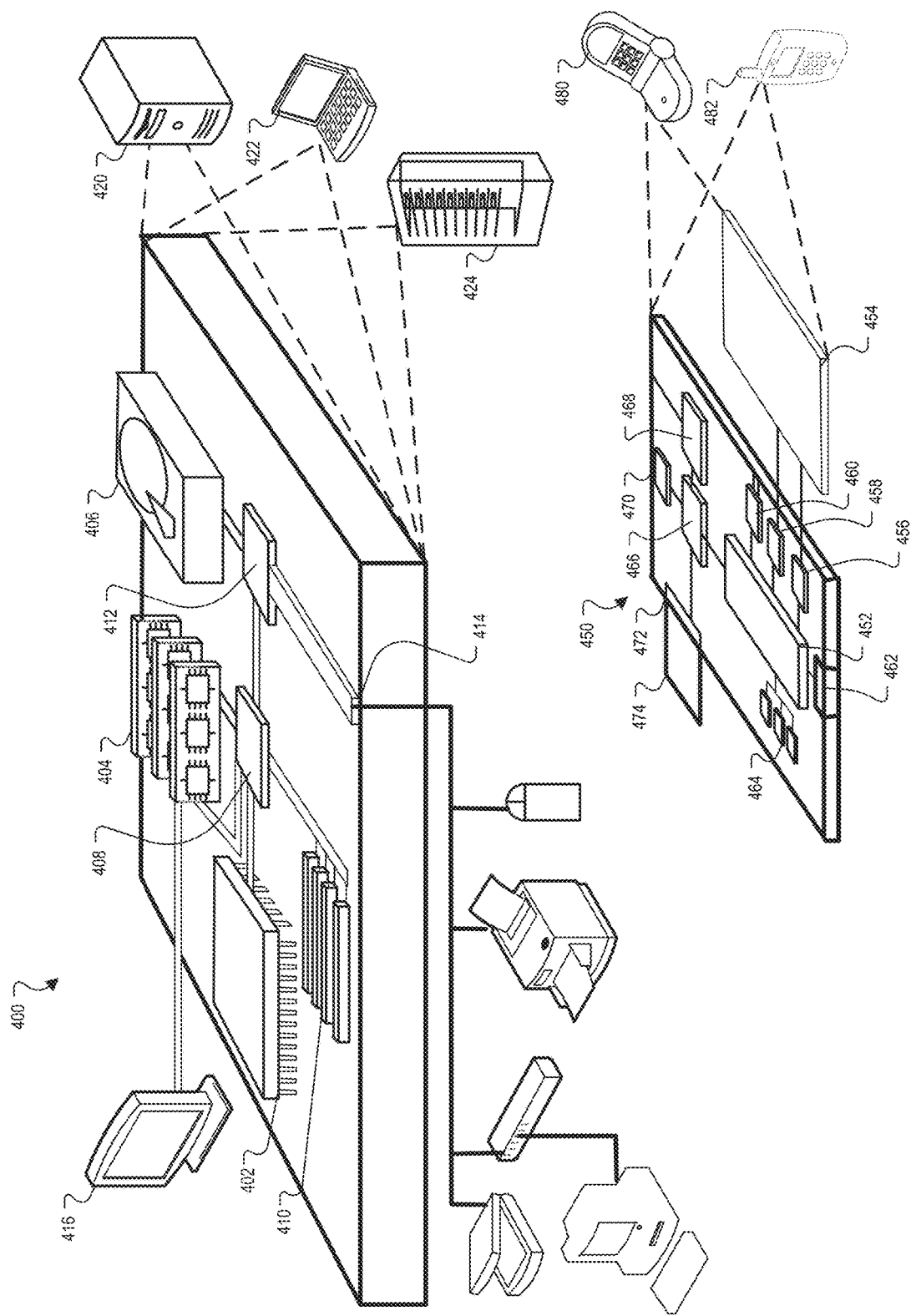
FIG. 4 shows an example of a computing device and a mobile computing device that can be used to implement the techniques described herein.

As described above, the calibration device 200 of FIGS. 2 and 3 can be operated using software executed by a computing device (e.g., the computer system 212 of FIGS. 2 and 3). In some implementations, the software is included on a computer-readable medium for execution on the computer system 212. FIG. 4 shows an example computing device 400 and an example mobile computing device 450, which can be used to implement the techniques described herein. For example, calibration of the transmitter 114 and/or calibration of the sensors 208 of the calibration device 200 may be executed and controlled by the computing device 400 and/or the mobile computing device 450. Computing device 400 is intended to represent various forms of digital computers, including, e.g., laptops, desktops, workstations, personal digital assistants, servers, blade servers, mainframes, and other appropriate computers. Computing device 450 is intended to represent various forms of mobile devices, including, e.g., personal digital assistants, cellular telephones, smartphones, and other similar computing devices. The components shown here, their connections and relationships, and their functions, are meant to be examples only, and are not meant to limit implementations of the techniques described and/or claimed in this document.

Computing device 400 includes processor 402, memory 404, storage device 406, high-speed interface 408 connecting to memory 404 and high-speed expansion ports 410, and low speed interface 412 connecting to low speed bus 414 and storage device 406. Each of components 402, 404, 406, 408, 410, and 412, are interconnected using various busses, and can be mounted on a common motherboard or in other manners as appropriate. Processor 402 can process instructions for execution within computing device 400, including instructions stored in memory 404 or on storage device 406, to display graphical data for a GUI on an external input/output device, including, e.g., display 416 coupled to high speed interface 408. In some implementations, multiple processors and/or multiple buses can be used, as appropriate, along with multiple memories and types of memory. Also, multiple computing devices 400 can be connected, with each device providing portions of the necessary operations (e.g., as a server bank, a group of blade servers, a multi-processor system, etc.).

Memory 404 stores data within computing device 400. In some implementations, memory 404 is a volatile memory unit or units. In some implementation, memory 604 is a non-volatile memory unit or units. Memory 404 also can be another form of computer-readable medium, including, e.g., a magnetic or optical disk.

Storage device 406 is capable of providing mass storage for computing device 400. In some implementations, storage device 406 can be or contain a computer-readable medium, including, e.g., a floppy disk device, a hard disk device, an optical disk device, a tape device, a flash memory or other similar solid state memory device, or an array of devices, including devices in a storage area network or other configurations. A computer program product can be tangibly embodied in a data carrier. The computer program product also can contain instructions that, when executed, perform one or more methods, including, e.g., those described above. The data carrier is a computer- or machine-readable medium, including, e.g., memory 404, storage device 406, memory on processor 402, and the like.

High-speed controller 408 manages bandwidth-intensive operations for computing device 400, while low speed controller 412 manages lower bandwidth-intensive operations. Such allocation of functions is an example only. In some implementations, high-speed controller 408 is coupled to memory 404, display 416 (e.g., through a graphics processor or accelerator), and to high-speed expansion ports 410, which can accept various expansion cards (not shown). In some implementations, the low-speed controller 412 is coupled to storage device 406 and low-speed expansion port 414. The low-speed expansion port, which can include various communication ports (e.g., USB, Bluetooth®, Ethernet, wireless Ethernet), can be coupled to one or more input/output devices, including, e.g., a keyboard, a pointing device, a scanner, or a networking device including, e.g., a switch or router (e.g., through a network adapter).

Computing device 400 can be implemented in a number of different forms, as shown in FIG. 4. For example, the computing device 400 can be implemented as standard server 420, or multiple times in a group of such servers. The computing device 400 can also can be implemented as part of rack server system 424. In addition or as an alternative, the computing device 400 can be implemented in a personal computer (e.g., laptop computer 422). In some examples, components from computing device 400 can be combined with other components in a mobile device (e.g., the mobile computing device 450). Each of such devices can contain one or more of computing device 400, 450, and an entire system can be made up of multiple computing devices 400, 450 communicating with each other.

Computing device 450 includes processor 452, memory 464, and an input/output device including, e.g., display 454, communication interface 466, and transceiver 468, among other components. Device 450 also can be provided with a storage device, including, e.g., a microdrive or other device, to provide additional storage. Components 450, 452, 464, 454, 466, and 468, may each be interconnected using various buses, and several of the components can be mounted on a common motherboard or in other manners as appropriate.

Processor 452 can execute instructions within computing device 450, including instructions stored in memory 464. The processor 452 can be implemented as a chipset of chips that include separate and multiple analog and digital processors. The processor 452 can provide, for example, for the coordination of the other components of device 450, including, e.g., control of user interfaces, applications run by device 450, and wireless communication by device 450.

Processor 452 can communicate with a user through control interface 458 and display interface 456 coupled to display 454. Display 454 can be, for example, a TFT LCD (Thin-Film-Transistor Liquid Crystal Display) or an OLED (Organic Light Emitting Diode) display, or other appropriate display technology. Display interface 456 can comprise appropriate circuitry for driving display 454 to present graphical and other data to a user. Control interface 458 can receive commands from a user and convert them for submission to processor 452. In addition, external interface 462 can communicate with processor 442, so as to enable near area communication of device 450 with other devices. External interface 462 can provide, for example, for wired communication in some implementations, or for wireless communication in some implementations. Multiple interfaces also can be used.

Memory 464 stores data within computing device 450. Memory 464 can be implemented as one or more of a computer-readable medium or media, a volatile memory unit or units, or a non-volatile memory unit or units. Expansion memory 474 also can be provided and connected to device 450 through expansion interface 472, which can include, for example, a SIMM (Single In Line Memory Module) card interface. Such expansion memory 474 can provide extra storage space for device 450, and/or may store applications or other data for device 450. Specifically, expansion memory 474 can also include instructions to carry out or supplement the processes described above and can include secure data. Thus, for example, expansion memory 474 can be provided as a security module for device 450 and can be programmed with instructions that permit secure use of device 450. In addition, secure applications can be provided through the SIMM cards, along with additional data, including, e.g., placing identifying data on the SIMM card in a non-hackable manner.

The memory 464 can include, for example, flash memory and/or NVRAM memory, as discussed below. In some implementations, a computer program product is tangibly embodied in a data carrier. The computer program product contains instructions that, when executed, perform one or more methods, including, e.g., those described above with respect to calibrating the transmitter 114 and/or calibrating the sensors 208 of the calibration device 200. The data carrier is a computer- or machine-readable medium, including, e.g., memory 464, expansion memory 474, and/or memory on processor 452, which can be received, for example, over transceiver 468 or external interface 462.

Device 450 can communicate wirelessly through communication interface 466, which can include digital signal processing circuitry where necessary. Communication interface 466 can provide for communications under various modes or protocols, including, e.g., GSM voice calls, SMS, EMS, or MMS messaging, CDMA, TDMA, PDC, WCDMA, CDMA2000, or GPRS, among others. Such communication can occur, for example, through radio-frequency transceiver 468. In addition, short-range communication can occur, including, e.g., using a Bluetooth®, WiFi, or other such transceiver (not shown). In addition, GPS (Global Positioning System) receiver module 470 can provide additional navigation- and location-related wireless data to device 450, which can be used as appropriate by applications running on device 450.

Device 450 also can communicate audibly using audio codec 460, which can receive spoken data from a user and convert it to usable digital data. Audio codec 460 can likewise generate audible sound for a user, including, e.g., through a speaker, e.g., in a handset of device 450. Such sound can include sound from voice telephone calls, recorded sound (e.g., voice messages, music files, and the like) and also sound generated by applications operating on device 450.

Computing device 450 can be implemented in a number of different forms, as shown in FIG. 4. For example, the computing device 450 can be implemented as cellular telephone 480. The computing device 450 also can be implemented as part of smartphone 482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include one or more computer programs that are executable and/or interpretable on a programmable system. This includes at least one programmable processor, which can be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to a computer program product, apparatus and/or device (e.g., magnetic discs, optical disks, memory, Programmable Logic Devices (PLDs)) used to provide machine instructions and/or data to a programmable processor, including a machine-readable medium that receives machine instructions.

To provide for interaction with a user, the systems and techniques described herein can be implemented on a computer having a display device (e.g., a CRT (cathode ray tube) or LCD (liquid crystal display) monitor) for presenting data to the user, and a keyboard and a pointing device (e.g., a mouse or a trackball) by which the user can provide input to the computer. Other kinds of devices can be used to provide for interaction with a user as well. For example, feedback provided to the user can be a form of sensory feedback (e.g., visual feedback, auditory feedback, or tactile feedback).

Input from the user can be received in a form, including acoustic, speech, or tactile input.

The systems and techniques described here can be implemented in a computing system that includes a backend component (e.g., as a data server), or that includes a middleware component (e.g., an application server), or that includes a frontend component (e.g., a client computer having a user interface or a Web browser through which a user can interact with an implementation of the systems and techniques described here), or a combination of such backend, middleware, or frontend components. The components of the system can be interconnected by a form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the components described herein can be separated, combined or incorporated into a single or combined component. The components depicted in the figures are not intended to limit the systems described herein to the software architectures shown in the figures.

A number of embodiments have been described. Nevertheless, it will be understood that various modifications may be made without departing from the spirit and scope of the disclosure. Accordingly, other embodiments are within the scope of the following claims.

What is claimed is:

1. A calibration device comprising:
   a plurality of magnetic sensors positioned at the calibration device, the plurality of magnetic sensors defining a space;
   a controller configured to be positioned in the space defined by the plurality of magnetic sensors, wherein the controller includes a first magnetic transmitter; and
   one or more processors configured to:
   cause the first magnetic transmitter to generate a plurality of magnetic fields;
   receive signals from the plurality of magnetic sensors that are based on characteristics of the plurality of magnetic fields received at the plurality of magnetic sensors;
   calculate, based on the signals received from the plurality of magnetic sensors, positions and orientations of the plurality of magnetic sensors relative to a position and orientation of the controller and the first magnetic transmitter;
   determine whether the calculated positions and orientations of the plurality of magnetic sensors are within one or more threshold limits of known positions and orientations of the plurality of magnetic sensors;
   cause a second magnetic transmitter of a reference controller to generate a second plurality of magnetic fields;
   receive second signals from the plurality of magnetic sensors that are based on characteristics of the second plurality of magnetic fields received at the plurality of magnetic sensors;
   calculate, based on the second signals received from the plurality of magnetic sensors, positions and orientations of the plurality of magnetic sensors relative to a position and orientation of the second magnetic transmitter;
   compare the calculated positions and orientations of the plurality of magnetic sensors to the known positions and orientations of the plurality of magnetic sensors; and
   based on the comparing, determine one or more calibration correction factors for one or more of the plurality of magnetic sensors.

2. The calibration device of claim 1, wherein the one or more processors are further configured to determine, based on a calibration algorithm, one or more calibration correction factors for the magnetic transmitter based on differences between the measured positions and orientations of the plurality of magnetic sensors and the known positions and orientations of the plurality of magnetic sensors.

3. The calibration device of claim 2, wherein the one or more processors are further configured to:
   create a calibration file that includes the calibration correction factors; and
   apply the calibration file to the magnetic transmitter.

4. The calibration device of claim 2, wherein the one or more threshold limits are zero such that calibration correction factors are determined for the magnetic transmitter irrespective of the differences between the measured positions and orientations of the plurality of magnetic sensors and the known positions and orientations of the plurality of magnetic sensors.

5. The calibration device of claim 1, comprising a mount that is configured to hold the controller and the magnetic transmitter in a fixed position and orientation relative to the plurality of sensors.

6. The calibration device of claim 1, wherein the controller is configured to communicate with the calibration device.

7. The calibration device of claim 1, wherein the controller is configured for use in one of both of an Augmented Reality (AR) system or a Virtual Reality (VR) system.

8. The calibration device of claim 1, wherein at least some of the plurality of magnetic sensors are removably fixed to the calibration device.

9. The calibration device of claim 1, wherein at least some of the plurality of magnetic sensors are movably attached to the calibration device such that one or both of the position or orientation of the at least some of the plurality of magnetic sensors is adjustable.

10. The calibration device of claim 1, wherein the one or more processors are in communication with a multiplexing switch that allows the one or more processors to receive the signals from each of the plurality of magnetic sensors in series.

11. The calibration device of claim 1, wherein the one or more processors are further configured to:
   create one or more calibration files that include the calibration correction factors; and
   apply the one or more calibration files to the one or more of the plurality of magnetic sensors.

12. A system comprising:
   a controller that includes a first magnetic transmitter;
   a calibration device comprising:
   a housing;
   a plurality of magnetic sensors positioned at the housing; and
   a mount positioned inside the housing, the mount configured to accept the controller; and
   a computer system in communication with the calibration device, the computer system configured to:

cause the first magnetic transmitter to generate a plurality of magnetic fields;
receive signals from the plurality of magnetic sensors that are based on characteristics of the plurality of magnetic fields received at the plurality of magnetic sensors;
calculate, based on the signals received from the plurality of magnetic sensors, positions and orientations of the plurality of magnetic sensors relative to a position and orientation of the controller and the first magnetic transmitter;
determine whether the calculated positions and orientations of the plurality of magnetic sensors are within one or more threshold limits of known positions and orientations of the plurality of magnetic sensors,
cause a second magnetic transmitter of a reference controller to generate a second plurality of magnetic fields;
receive second signals from the plurality of magnetic sensors that are based on characteristics of the second plurality of magnetic fields received at the plurality of magnetic sensors;
calculate, based on the second signals received from the plurality of magnetic sensors, positions and orientations of the plurality of magnetic sensors relative to a position and orientation of the second magnetic transmitter;
compare the calculated positions and orientations of the plurality of magnetic sensors to the known positions and orientations of the plurality of magnetic sensors; and
based on the comparing, determine one or more calibration correction factors for one or more of the plurality of magnetic sensors.

13. The system of claim 12, wherein the computer system is further configured to determine, based on a calibration algorithm, one or more calibration correction factors for the magnetic transmitter based on differences between the measured positions and orientations of the plurality of magnetic sensors and the known positions and orientations of the plurality of magnetic sensors.

14. The system of claim 13, wherein the computer system is further configured to:
create a calibration file that includes the calibration correction factors; and
apply the calibration file to the magnetic transmitter.

15. The system of claim 12, wherein the mount is configured to hold the controller and the magnetic transmitter in a fixed position and orientation relative to the plurality of sensors.

16. The system of claim 12, wherein the controller is configured to communicate with one or both of the computer system or the calibration device.

17. The system of claim 12, wherein the controller is configured for use in one of both of an Augmented Reality (AR) system or a Virtual Reality (VR) system.

18. The system of claim 12, wherein at least some of the plurality of magnetic sensors are removably fixed to the calibration device.

19. The system of claim 12, wherein at least some of the plurality of magnetic sensors are movably attached to the calibration device such that one or both of the position or orientation of the at least some of the plurality of magnetic sensors is adjustable.

20. The system of claim 12, further comprising a multiplexing switch in communication with the computer system that allows the computer system to receive the signals from each of the plurality of magnetic sensors in series.

21. The system of claim 12, wherein the computer system is further configured to:
create one or more calibration files that include the calibration correction factors; and
apply the one or more calibration files to the one or more of the plurality of magnetic sensors.

* * * * *